United States Patent
Kondo et al.

(10) Patent No.: US 9,602,102 B2
(45) Date of Patent: Mar. 21, 2017

(54) MAGNETIC LOGIC DEVICE, MAGNETIC LOGIC CIRCUIT, AND MAGNETIC MEMORY

(71) Applicant: Kabushiki Kaisha Toshiba, Minato-ku (JP)

(72) Inventors: Tsuyoshi Kondo, Kawasaki (JP); Hirofumi Morise, Yokohama (JP); Shiho Nakamura, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/861,199

(22) Filed: Sep. 22, 2015

(65) Prior Publication Data

US 2016/0087631 A1    Mar. 24, 2016

(30) Foreign Application Priority Data

Sep. 22, 2014  (JP) ................. 2014-192869

(51) Int. Cl.
- *G11C 11/02*  (2006.01)
- *H03K 19/00*  (2006.01)
- *H03K 19/18*  (2006.01)
- *H03K 19/20*  (2006.01)
- *G11C 11/16*  (2006.01)

(52) U.S. Cl.
CPC ........ *H03K 19/0008* (2013.01); *G11C 11/161* (2013.01); *G11C 11/165* (2013.01); *H03K 19/18* (2013.01); *H03K 19/20* (2013.01)

(58) Field of Classification Search
CPC .... H03K 19/20; H03K 19/18; H03K 19/0008; G11C 11/165; G11C 11/161

USPC ........................................... 365/158
See application file for complete search history.

(56) References Cited

U.S. PATENT DOCUMENTS

| | | | | |
|---|---|---|---|---|
| 7,126,873 | B2* | 10/2006 | See ............... | G11C 16/02 365/185.11 |
| 8,958,241 | B2* | 2/2015 | Kondo ............ | G11C 11/02 257/295 |
| 9,105,832 | B2* | 8/2015 | Buhrman ........ | G11C 11/18 |
| 2005/0286284 | A1* | 12/2005 | See ............... | G11C 16/02 365/63 |

(Continued)

FOREIGN PATENT DOCUMENTS

| JP | 2007-123838 | 5/2007 |
|---|---|---|
| JP | 2010-218678 | 9/2010 |

OTHER PUBLICATIONS

D. A. Allwood et al. "Magnetic Domain-Wall Logic", Science, vol. 309, Sep. 9, 2005, 6 pages.

(Continued)

*Primary Examiner* — Pho M Luu
*Assistant Examiner* — Xiaochun L Chen
(74) *Attorney, Agent, or Firm* — Oblon, McClelland, Maier & Neustadt, L.L.P.

(57) ABSTRACT

One embodiment provides a magnetic logic device including: a first conductive thin wire; a second conductive thin wire; and a third conductive thin wire that electrically connects the first conductive thin wire and the second conductive thin wire. The first to third conductive thin wires commonly includes: a first non-magnetic metal layer; a second non-magnetic metal layer; and a magnetic metal layer sandwiched between the first non-magnetic metal layer and the second non-magnetic metal layer.

20 Claims, 18 Drawing Sheets

CROSS SECTION (A-A' OR B-B') OF CONDUCTIVE THIN WIRE

TOP VIEW OF MAGNETIC LOGIC DEVICE

(56) References Cited

U.S. PATENT DOCUMENTS

| | | |
|---|---|---|
| 2007/0090835 A1 | 4/2007 | Pullini et al. |
| 2010/0232055 A1 | 9/2010 | Lee et al. |
| 2014/0104941 A1* | 4/2014 | Kondo .................... G11C 11/02 365/171 |
| 2014/0169088 A1* | 6/2014 | Buhrman ................ G11C 11/18 365/158 |

OTHER PUBLICATIONS

P. P. J. Haazen et al. "Domain Wall Depinning Governed by the Spin Hall Effect", Nature Materials, vol. 12, Apr. 2013, 5 pages.
Luqiao Liu et al. "Review and Analysis of Measurements of the Spin Hall Effect in Platinum", arXiv:1111.3702, 2011, 32 pages.

* cited by examiner

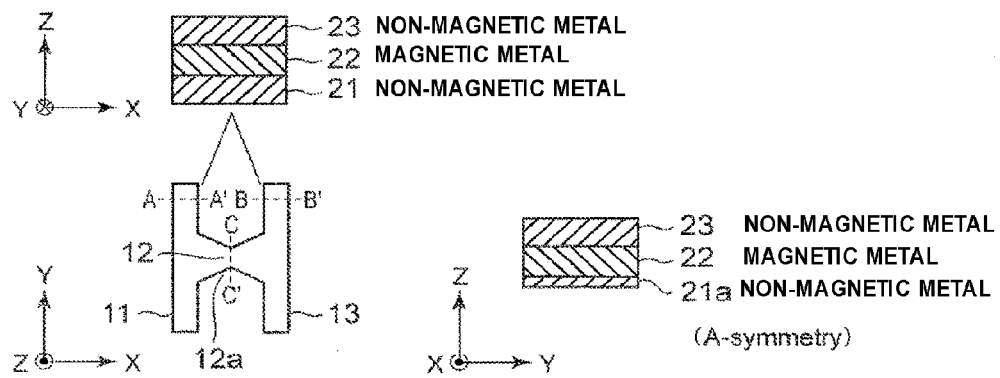
FIG. 1A
CROSS SECTION (A-A' OR B-B') OF
CONDUCTIVE THIN WIRE
FIG. 1B
TOP VIEW OF
MAGNETIC LOGIC DEVICE
FIG. 1C
CROSS SECTION (C-C') OF
CONDUCTIVE THIN WIRE
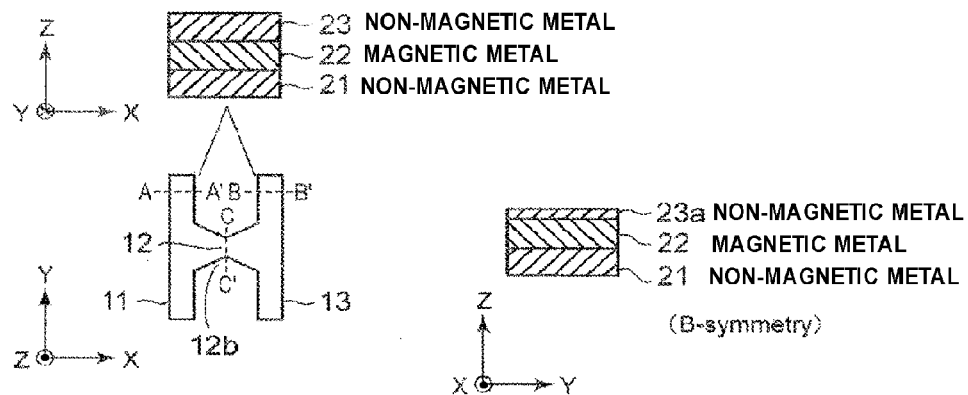
FIG. 2A
CROSS SECTION (A-A' OR B-B') OF
CONDUCTIVE THIN WIRE
FIG. 2B
TOP VIEW OF
MAGNETIC LOGIC DEVICE
FIG. 2C
CROSS SECTION (C-C') OF
CONDUCTIVE THIN WIRE

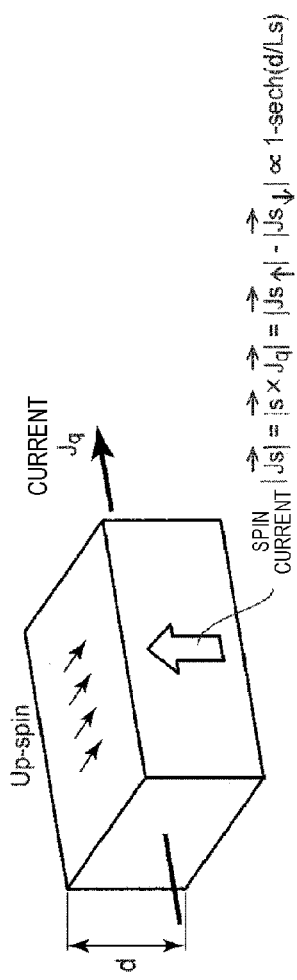
FIG. 3A
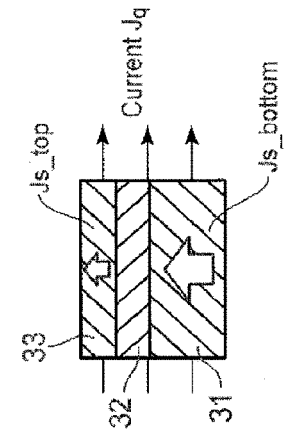
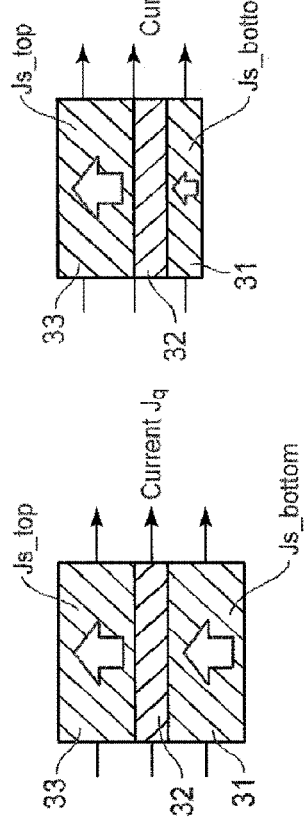
FIG. 3B  FIG. 3C  FIG. 3D (A-symmetry)
*FIG. 4A*  *FIG. 4B*
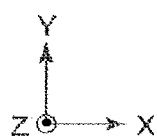
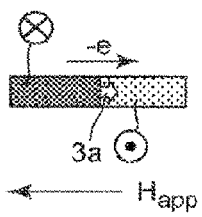
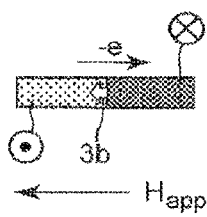
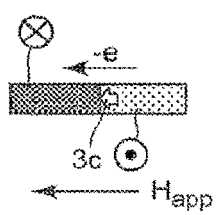
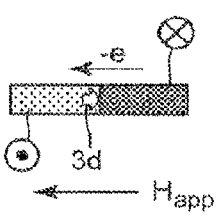
*FIG. 4C*  *FIG. 4D*
(B-symmetry)
*FIG. 5A*  *FIG. 5B*
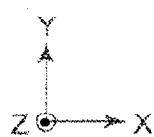
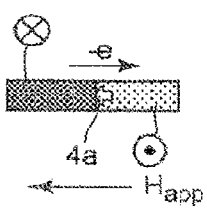
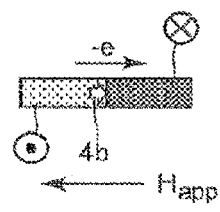
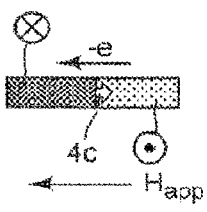
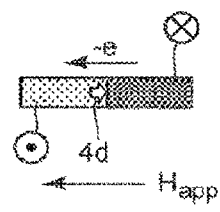
*FIG. 5C*  *FIG. 5D*

FIG. 6A
INPUTS
FIG. 6B
OR OPERATION
FIG. 6C
AND OPERATION
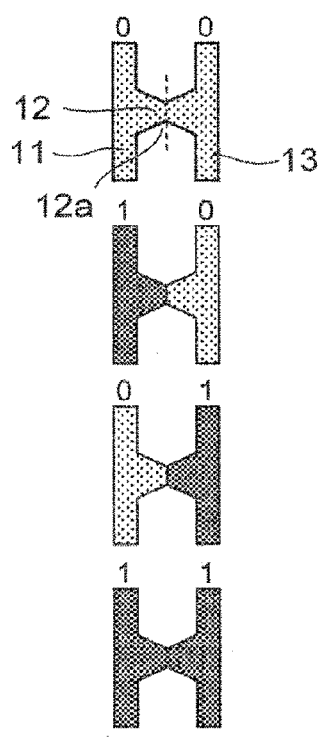
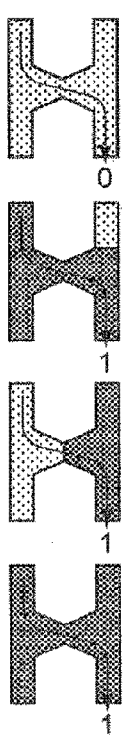
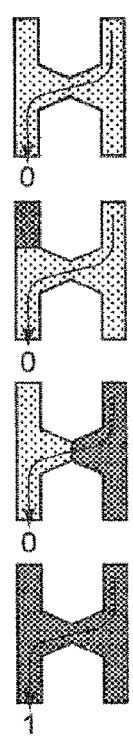
← $H_{app}$
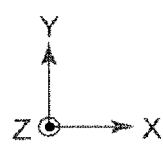

FIG. 7A
INPUTS
FIG. 7B
AND OPERATION
FIG. 7C
OR OPERATION
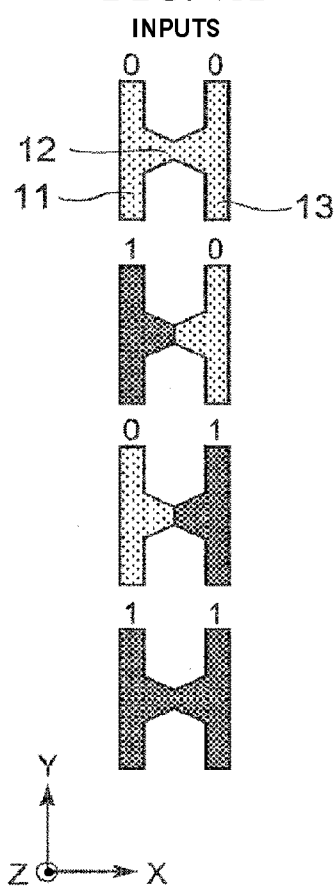
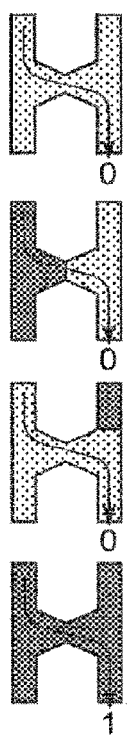
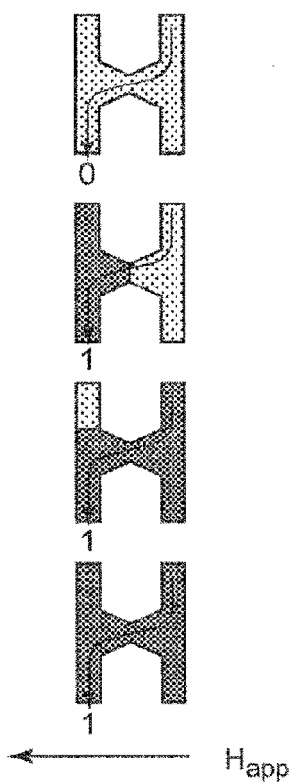

MAGNETIC LOGIC DEVICE, MAGNETIC LOGIC CIRCUIT, AND MAGNETIC MEMORY

CROSS-REFERENCE TO RELATED APPLICATION(S)

This application claims priority from Japanese Patent Application No. 2014-192869 filed on Sep. 22, 2014, the entire contents of which are incorporated herein by reference.

FIELD

Embodiments described herein generally relate to a magnetic logic device, a magnetic logic circuit, and a magnetic memory.

BACKGROUND

The information processing abilities of semiconductor integrated circuits (LSIs) are increasing consistently. On the other hand, their power consumptions also increases as the information processing abilities increase, and it is desired to provide some countermeasures against that tendency.

For example, as a promising solution to reduce power consumptions, a magnetic logic device incorporating a magnetoresistive device capable of holding information without supply of power may be used. However, further improvements are required in current logic circuits using such a magnetic logic device.

BRIEF DESCRIPTION OF DRAWINGS

A general architecture that implements the various features of the present invention will now be described with reference to the drawings. The drawings and the associated descriptions are provided to illustrate embodiments and not to limit the scope of the present invention.

FIGS. 1A-1C illustrate a magnetic logic device according to Embodiment 1.

FIGS. 2A-2C illustrate a magnetic logic device according to Embodiment 2.

FIGS. 3A-3D illustrate the film thickness dependence of a spin current due to the spin Hall effect.

FIGS. 4A-4D illustrate a movement of a magnetic wall by causing an electron flow in the magnetic logic device according to Embodiment 1.

FIGS. 5A-5D illustrate a movement of a magnetic wall by causing an electron flow in the magnetic logic device according to Embodiment 2.

FIGS. 6A-6C illustrate logic gate operations performed by the magnetic logic device according to Embodiment 1.

FIGS. 7A-7C illustrate logic gate operations performed by the magnetic logic device according to Embodiment 2.

DETAILED DESCRIPTION

Figure 8A:
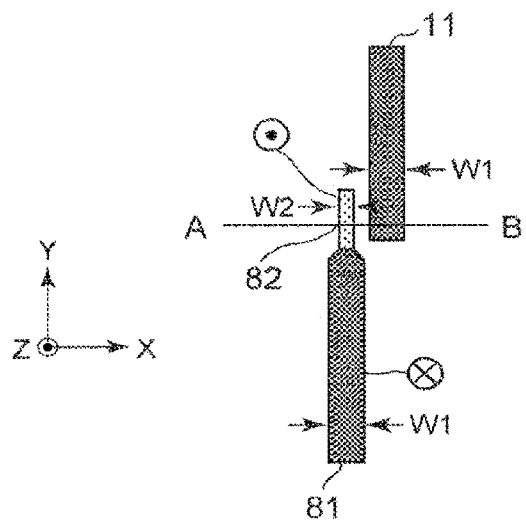
FIGS. 8A-10 illustrate example configurations of transmitting an output by applying magnetic coupling to conductive thin wires as used in Embodiment 1.

Embodiments relate to a magnetic logic device, a magnetic logic circuit, and a magnetic memory that use (magnetic) domains and domain walls in conductive thin wires. A magnetic logic device is formed using a magnetic material.

In the embodiments, information to be subjected to an operation or processing is expressed using domains and a magnetic wall in a conductive thin wire. As in conventional LSIs, a current or voltage is used as drive force of an information processing operation. The embodiments will be hereinafter described with reference to the drawings.

FIGS. 1A-1C illustrate a magnetic logic device according to Embodiment 1. As shown in FIG. 1B, the magnetic logic device is equipped with a first conductive thin wire 11, a second conductive thin wire 13, and a third conductive thin wire 12 that electrically connects a side portion of the first conductive thin wire 11 and a side portion of the second conductive thin wire 13.

The longitudinal directions of the first conductive thin wire 11 and the second conductive thin wire 13 are in the Y-axis direction and the longitudinal direction of the third conductive thin wire 12 are in the X-axis direction. The first conductive thin wire 11, the second conductive thin wire 13, and the third conductive thin wire 12 have in common a laminated body in which a magnetic metal layer 22 is sandwiched between a first non-magnetic metal layer 21 or 21a and a second non-magnetic metal layer 23.

FIG. 1A is a sectional view of the first conductive thin wire 11 (taken along line A-A') or the second conductive thin wire 13 (taken along line B-B'). As shown in FIG. 1A, each of the first conductive thin wire 11 and the second conductive thin wire 13 has a portion of the laminated body in which the magnetic metal layer 22 is sandwiched between the first non-magnetic metal layer 21 and the second non-magnetic metal layer 23.

FIG. 1C is a sectional view of the third conductive thin wire 12 taken along line C-C'. As shown in FIG. 1C, the third conductive thin wire 12 has a portion of the laminated body in which the magnetic metal layer 22 is sandwiched between the first non-magnetic metal layer 21a and the second non-magnetic metal layer 23.

In the third conductive thin wire 12, the film thickness of the first non-magnetic metal layer 21a is different from that of the second non-magnetic metal layer 23. In Embodiment 1, the second non-magnetic metal layer 23 is thicker than the first non-magnetic metal layer 21a. That is, the non-magnetic metal layer 23 which is located above in the Z-axis direction is thick and the non-magnetic metal layer 21a which located below is thin. In this specification, this type is referred to here as an "A-symmetry type." The third conductive thin wire 12 has a constriction 12a where the width is narrowed in the Y-axis direction.

As mentioned above, the first conductive thin wire 11, the second conductive thin wire 13, and the third conductive thin wire 12 have, as common films, the laminated body consisting of the first non-magnetic metal layer 21 or 21a, the magnetic metal layer 22, and the second non-magnetic metal layer 23. That is, the portions, belonging to the first conductive thin wire 11, the second conductive thin wire 13, and the third conductive thin wire 12, respectively, of each of the first non-magnetic metal layer 21 or 21a, the magnetic metal layer 22, and the second non-magnetic metal layer 23 constitute a common film that is electrically continuous.

In Embodiment 1, the portions, belonging to the first conductive thin wire 11 and the second conductive thin wire 13, respectively, of each of the non-magnetic metal layers 21 and 23 are substantially the same in metal composition and thickness. On the other hand, as shown in FIG. 1C, the thicknesses of the non-magnetic metal layers 21a and 23 are different from each other particularly in the constriction 12a. In Embodiment 1, the bottom non-magnetic metal layer 21a is thinner than the top non-magnetic metal layer 23.

As shown in FIG. 1B, the constriction 12a is formed in the third conductive thin wire 12 and between the first conductive thin wire 11 and the second conductive thin wire 13. The constriction 12a is formed to realize magnetization orientations in the first conductive thin wire 11 and the second conductive thin wire 13.

Since the third conductive thin wire 12 has the constriction 12a which is narrower than the other portions, its portions bounded by the narrowest portion (indicated by line C-C') of the constriction 12a are magnetized differently. More specifically, the portion, located on the first conductive thin wire 11 side of the line C-C', of the third conductive thin wire 12 is magnetized in the same direction as (i.e., parallel with) the first conductive thin wire 11. And the portion, located on the second conductive thin wire 13 side of the line C-C', of the third conductive thin wire 12 is magnetized in the same direction as (i.e., parallel with) the second conductive thin wire 13. This phenomenon is due to a general property that a magnetic wall moves to a position where the cross section is small.

In Embodiment 1, the magnetic metal layer 22 of the first conductive thin wire 11, the second conductive thin wire 13, and the third conductive thin wire 12 is made of a ferromagnetic material or a ferrimagnetic material or formed as an artificial lattice.

The ferromagnetic material may be an alloy of at least one element selected from iron (Fe), cobalt (Co), nickel (Ni), manganese (Mn), and chromium (Cr) and at least one element selected from platinum (Pt), palladium (Pd), iridium (Ir), ruthenium (Ru), and rhodium (Rh). Alternatively, the ferromagnetic material may be CoPt, NiFe, CoCrPt, etc. The properties of the ferromagnetic material can be varied by changing the composition, heat treatment, etc. The ferrimagnetic material may be an amorphous alloy of rare-earth metal and transition metal, such as TbFeCo or GdFeCo.

The above materials have a property that they tend to be magnetized in the Z-axis direction (lamination direction) when deposited as a thin film under properly selected conditions by a sputtering device. Therefore, they can be used when it is desired to magnetize the magnetic metal layer 22 in the Z-axis direction.

Examples of the artificial lattice are Co/Pt, Co/Pd, and Co/Ni, which make it possible to magnetize a magnetic metal layer in the Z-axis direction. These substances tend to have the <0001>orientation (close-packed hexagonal structure) or the <111>orientation (face-centered cubic structure).

The non-magnetic metal layers 21 or 21a and 23 of the first conductive thin wire 11, the second conductive thin wire 13, and the third conductive thin wire 12 are made of a conductive material. The conductive material may be platinum (Pt), palladium (Pd), iridium (Ir), or ruthenium (Rh), or rhodium (Rh) or an alloy of some of these elements.

FIGS. 2A-2C illustrate a magnetic logic device according to Embodiment 2. Wires and layers in FIGS. 2A-2c having the same or corresponding ones in FIGS. 1A-1C are given the same reference numeral as the latter and descriptions therefor will be omitted.

As shown in FIG. 2B, the magnetic logic device according to Embodiment 2 is also equipped with a first conductive thin wire 11, a second conductive thin wire 13, and a third conductive thin wire 12 that electrically connects a side portion of the first conductive thin wire 11 and a side portion of the second conductive thin wire 13. As in Embodiment 1, the longitudinal directions of the first conductive thin wire 11 and the second conductive thin wire 13 are in the Y-axis direction and the longitudinal direction of the third conductive thin wire 12 are in the X-axis direction.

The first conductive thin wire 11, the second conductive thin wire 13, and the third conductive thin wire 12 have in common a laminated body in which a magnetic metal layer 22 is sandwiched between a first non-magnetic metal layer 21 and a second non-magnetic metal layer 23 or 23a. Like FIG. 1A, FIG. 2A is a sectional view of the first conductive thin wire 11 (taken along line A-A') or the second conductive thin wire 13 (taken along line B-B').

FIG. 2C is a sectional view of the third conductive thin wire 12 taken along line C-C'. As shown in FIG. 2C, the third conductive thin wire 12 has the laminated body in which the magnetic metal layer 22 is sandwiched between the first non-magnetic metal layer 21 and the second non-magnetic metal layer 23a.

As in Embodiment 1, in the third conductive thin wire 12, the film thickness of the first non-magnetic metal layer 21 is different from that of the second non-magnetic metal layer 23a. However, unlike in Embodiment 1, the second non-magnetic metal layer 23a which is located above in the Z-axis direction is thinner than the first non-magnetic metal layer 21 (i.e., their thickness relationship is opposite to that in Embodiment 1). That is, the non-magnetic metal layer 23a which is located above in the Z-axis direction is thin and the non-magnetic metal layer 21 which located below is thick. In this specification, this type is referred to as a "B-symmetry type." The third conductive thin wire 12 has a constriction 12b where the width is narrowed in the Y-axis direction.

As mentioned above, the first conductive thin wire 11, the second conductive thin wire 13, and the third conductive thin wire 12 have, as common films, the laminated body consisting of the first non-magnetic metal layer 21, the magnetic metal layer 22, and the second non-magnetic metal layer 23 or 23a. That is, the portions, belonging to the first conductive thin wire 11, the second conductive thin wire 13, and the third conductive thin wire 12, respectively, of each of the first non-magnetic metal layer 21, the magnetic metal layer 22, and the second non-magnetic metal layer 23 or 23a constitute a common film that is electrically continuous.

In Embodiment 2, the portions, belonging to the first conductive thin wire 11 and the second conductive thin wire 13, respectively, of each of the non-magnetic metal layers 21, 23 and 23a are substantially the same in metal composition and thickness. On the other hand, as shown in FIG.

2C, the thicknesses of the non-magnetic metal layers 21 and 23a are different from each other particularly in the constriction 12b. In Embodiment 2, the bottom non-magnetic metal layer 21 is thicker than the top non-magnetic metal layer 23a.

As shown in FIG. 2B, the constriction 12b is formed in the third conductive thin wire 12 and between the first conductive thin wire 11 and the second conductive thin wire 13.

Now, referring to FIGS. 3A-3D, a description will be made of the film thickness dependence of a spin current occurring in a non-magnetic metal layer due to the spin Hall effect. FIGS. 3A-3D relate to the magnetic logic devices according to Embodiment 1 and Embodiment 2, and illustrate the film thickness dependence of a spin current occurring in a non-magnetic metal layer due to the spin Hall effect.

When a current flows through a metal layer made of such an element as Pt or Pd having strong spin-orbit coupling, remarkable spin dependence appears in the direction in which electrons are scattered and a spin current occurs perpendicularly to the current direction.

FIG. 3A shows relationships between the directions of a current, a spin current, and spin polarization that is caused by the spin current. As shown in FIG. 3A, when a current Jq flows left to right through a non-magnetic metal layer, an induced spin current Js flows in a direction indicated by:

$$\vec{J}_s = \vec{s} \times \vec{J}_q \qquad \text{[Formula 1]}$$

Where as shown in FIG. 3A the non-magnetic metal layer has a limited thickness d, the magnitude of the spin current Js is proportional to a function $1-\text{sech}(d/L_s)$ where parameters d and Ls are the layer thickness and the spin diffusion length, respectively (refer to Liu L. et al. (2011) "*Review and Analysis of Measurements of the Spin Hall Effect in Platinum*" arXiv: 1111.3702). This function means that whereas the magnitude of Js is regarded constant if the thickness d is sufficiently greater than the spin diffusion length Ls, the magnitude of Js becomes smaller as the thickness d decreases if d is in the same level as or smaller than Ls.

FIG. 3B shows a three-layer structure consisting of a bottom non-magnetic metal layer 31, a magnetic metal layer 32, and a top non-magnetic metal layer 33 in which the top non-magnetic metal layer 33 and the bottom non-magnetic metal layer 31 are approximately the same in thickness. When a current Jq flows through this structure, as shown in FIG. 3B, even though a spin current flows into the magnetic metal layer 32 from the bottom non-magnetic metal layer 31, approximately the same spin current flows out of the magnetic metal layer 32 to the top non-magnetic metal layer 33 (see FIG. 3B). Therefore, the magnetic metal layer 32 receives almost no influence of spin currents that are induced by the spin Hall effect.

In other words, because of the definition of the spin current, it can be said that the amount of spins injected into the magnetic metal layer 32 from the top non-magnetic metal layer 33 is approximately the same as that from the bottom non-magnetic metal layer 31 and the two sets of spins cancel out each other.

On the other hand, where the film thicknesses of the top non-magnetic metal layer 33 and the bottom non-magnetic metal layer 31 are different from each other but in the same level as the spin diffusion length Ls, a spin current occurring in the thicker layer dominantly influences the magnetic metal layer 32 (see FIGS. 3C and 3D). That is, in the case of FIG. 3C, the spin current Js is considered due to downward spins being transported to the magnetic metal layer 32.

In the case of FIG. 3D, the spin current Js is considered due to upward spins being transported to the magnetic metal layer 32.

Because of the above difference in spin direction, the direction of torque acting on a magnetic wall in the case of FIG. 3C is opposite to that in the case of FIG. 3D.

As described later with reference to FIGS. 6A-6C and 7A-7C, each of the magnetic logic device according to Embodiment 1 (see FIGS. 1A-1C) and the magnetic logic device according to Embodiment 2 (see FIGS. 2A-2C) functions as an AND gate or an OR gate even alone.

Now, a description will be made of how a magnetic wall is moved in magnetic logic devices. FIGS. 4A and 4B illustrate how the magnetic wall is moved when an electron flow flows through the conductive thin wire 12 having the constriction 12a of the magnetic logic device (A-symmetry type) according to Embodiment 1 (see FIGS. 1A-1C).

It is assumed that, similarly to FIG. 1B, the axis of easy magnetization (the crystallographic direction in which magnetization tends to occur) of the first conductive thin wire 11, the second conductive thin wire 13, and the constriction 12a is parallel with the Z-axis direction which is the same as the lamination direction of the two non-magnetic metal layers 21 and 23 and the magnetic metal layer 22 (see FIG. 1B).

In the following description, magnetization directions of domains will be indicated by dot densities in drawings. In FIGS. 4A-4D, low-density dots indicate magnetization that is directed to the viewer's side (i.e., upward in the Z-axis direction) and high-density dots indicate magnetization that is directed to the side opposite to the viewer's side (i.e., downward in the Z-axis direction). The term "electron flow" will be used instead of the term "current."

To cause operations described below, the movement of the magnetic wall is stabilized if its structure is made uniform. To this end, as shown in FIGS. 4A-4D, a static magnetic field Happ may be applied in the right-to-left direction in the paper surface along the X-axis. Although not shown in FIGS. 4A-4D, magnetic logic devices may be provided with a magnetic field application unit for applying a magnetic field to the conductive thin wires 11 and 13 and the constriction 12a or 12b. Although not shown in FIGS. 4A-4D, the movement of the magnetic wall is stabilized also when a static magnetic field is applied in the direction (left to right in the paper surface) opposite to the direction of the static magnetic field Happ. In this case, the relationship between an electron flow and a movement direction of the magnetic wall is reversed.

Now, unlike in Embodiment 1 and Embodiment 2, a case where each of the conductive thin wires 11 and 13 is formed by only a magnetic metal layer (i.e., it is equipped with no non-magnetic metal layer) is assumed. When an electron flow flows through such a conductive thin wire that is formed by only a magnetic metal layer (i.e., equipped with no non-magnetic metal layers), the magnetic wall is moved in the same direction as the electron flow as if to be pushed by the electron flow. This is considered a result of action that the spin-polarized electron flow exerts torque on the magnetic moment of the magnetic wall. It is known that in this case the movement direction of the magnetic wall is not influenced by the magnetization directions of the domains located on the two respective sides of the magnetic wall, the application of a magnetic field, or the like.

In contrast, a different situation arises in a case that, as in the constriction 12a of the magnetic logic device according to Embodiment 1 (see FIGS. 1A-1C), the magnetic metal layer 22 is sandwiched between the two non-magnetic metal layers 21a and 23 one (non-magnetic metal layer 23) of which is thicker than the other (non-magnetic metal layer 21a). When an electron flow is caused to flow through the constriction 12a of the magnetic logic device according to Embodiment 1 (see FIGS. 1A-1C), electron flows also flow through the non-magnetic metal layers 21a and 23 in addition to the magnetic metal layer 22.

Where the non-magnetic metal layers 21a and 23 are made of such an element as platinum (Pt), palladium (Pd), iridium (Tr), or ruthenium (Ru), or rhodium (Rh), the electron flow (conduction electrons) flowing through each of the non-magnetic metal layers 21a and 23 senses strong spin-orbit coupling ascribed to the constituent element. As a result, a spin polarization distribution due to a phenomenon called the spin Hall effect (SHE) occurs in the non-magnetic metal layers 21a and 23.

The SHE is a phenomenon that when a current flows through a non-magnetic metal or semiconductor, a flow of electron spins (a flow of magnetism) occurs perpendicularly to the current. An electron has two attributes, that is, charge and spin and the spin has two states, that is, upward and downward.

When a current flows through a non-magnetic substance, up-spin electrons and down-spin electrons are stored at two ends in a direction that is perpendicular to the current, whereby a spin current occurs. In this manner, utilizing the SHE, magnetization can be controlled by generating a spin current by a current.

In Embodiment 1, since the non-magnetic metal layers 21a and 23 are in contact with the magnetic metal layer 22, a phenomenon occurs that excess spins generated by the SHE flow into the magnetic metal layer 22 (spin injection). The spin injection from each of the non-magnetic metal layer 21a and 23 to the magnetic metal layer 22 acts on the magnetic wall, which, however, causes a different result than ordinary spin torque does.

FIG. 4A shows a case that an electron flow (–e) flows left to right in the X-axis direction. Reference symbol 3a denotes a magnetic wall and its movement direction is indicated by an arrow. As shown in FIG. 4A, the magnetic wall 3a having downward magnetization (indicated by high-density dots) and upward magnetization (indicated by low-density dots) in the Z-axis direction on the left-hand side and the right-hand side in the paper surface, respectively, is moved in the same direction as the electron flow (–e).

FIG. 4B shows a case that as in the case of FIG. 4A an electron flow (–e) flows left to right in the X-axis direction. As shown in FIG. 4B, a magnetic wall 3b having downward magnetization (indicated by high-density dots) and upward magnetization (indicated by low-density dots) in the Z-axis direction on the right-hand side and the left-hand side in the paper surface, respectively, is moved in the direction opposite to the direction of the electron flow (–e).

FIG. 4C shows a case that an electron flow (–e) flows right to left in the X-axis direction. As shown in FIG. 4C, a magnetic wall 3c having downward magnetization (indicated by high-density dots) and upward magnetization (indicated by low-density dots) in the Z-axis direction on the left-hand side and the right-hand side in the paper surface, respectively, is moved in the same direction as the electron flow (–e).

FIG. 4D shows a case that as in the case of FIG. 4C an electron flow (–e) flows right to left in the X-axis direction. As shown in FIG. 4D, a magnetic wall 3d having downward magnetization (indicated by high-density dots) and upward magnetization (indicated by low-density dots) in the Z-axis direction on the right-hand side and the left-hand side in the paper surface, respectively, is moved in the direction opposite to the direction of the electron flow (–e).

The action of moving the magnetic wall due to the SHE occurring in the non-magnetic metal layers 21 and 23 also occurs in the conductive thin wires 11 and 13. If an electron flow flows through the conductive thin wire 12 in the same direction (in the X-direction) as shown in FIG. 4A, as in the constriction 12a, upward excess spins are injected into the magnetic metal layer 22 from the non-magnetic metal layer 21a and downward excess spins are injected into the magnetic metal layer 22 from the non-magnetic metal layer 23. In each of the conductive thin wires 11 and 13 in which the film thicknesses of the non-magnetic metal layers 21 and 23 are the same, the action of SPE-induced spin injection from the first conductive thin wire 11 and that from the third conductive thin wire 13 cancel out each other (the thickness of the non-magnetic metal layer 21a is shorted than the spin diffusion length). As a result, the magnetic wall is moved by spin torque.

FIGS. 5A-5D illustrate how the magnetic wall is moved when an electron flow flows through the conductive thin wire 12 having the constriction 12b of the magnetic logic device (B-symmetry type) according to Embodiment 2 (see FIGS. 2A-2C).

In the constriction 12b of the conductive thin wire 12 of the magnetic logic device according to Embodiment 2, the relationship between the film thicknesses of the non-magnetic metal layers 21 and 23a which are arranged in the Z-axis direction is opposite to that in the constriction 12a of the conductive thin wire 12 of the magnetic logic device according to Embodiment 1 (A-symmetry type). Therefore, in the constriction 12b of the conductive thin wire 12 of the magnetic logic device according to Embodiment 2, as shown in FIGS. 5A-5D, the relationship between the direction of an electron flow and the movement direction of the magnetic wall is opposite to that in the constriction 12a illustrated by FIGS. 4A-4C.

FIG. 5A shows a case that an electron flow (–e) flows in the left-to-right direction of the paper along the X-axis direction. As shown in FIG. 5A, a magnetic wall 4a having downward magnetization (indicated by high-density dots) and upward magnetization (indicated by low-density dots) in the Z-axis direction on the left-hand side and the right-hand side in the paper surface, respectively, is moved in the direction opposite to the direction of the electron flow (–e).

FIG. 5B shows a case that as in the case of FIG. 5A an electron flow (–e) flows in the left-to-right direction of the paper along the X-axis direction. As shown in FIG. 5B, a magnetic wall 4b having downward magnetization (indicated by high-density dots) and upward magnetization (indicated by low-density dots) in the Z-axis direction on the right-hand side and the left-hand side in the paper surface, respectively, is moved in the same direction as the electron flow (–e).

FIG. 5C shows a case that an electron flow (–e) flows right to left in the X-axis direction. As shown in FIG. 5C, a magnetic wall 4c having downward magnetization (indicated by high-density dots) and upward magnetization (indicated by low-density dots) in the Z-axis direction on the left-hand side and the right-hand side in the paper surface, respectively, is moved in the direction opposite to the direction of the electron flow (–e).

FIG. 5D shows a case that as in the case of FIG. 5C an electron flow (–e) flows right to left in the X-axis direction. As shown in FIG. 5D, a magnetic wall 4d having downward magnetization (indicated by high-density dots) and upward magnetization (indicated by low-density dots) in the Z-axis direction on the right-hand side and the left-hand side in the paper surface, respectively, is moved in the same direction as the electron flow (−e).

As described above, a magnetic wall can be driven in the above-described manner by, for example, producing a difference between the amounts of spin injection from two respective non-magnetic metal layers between which a magnetic metal layer is sandwiched by, for example, setting the film thicknesses of the two non-magnetic metal layers different from each other as in Embodiment 1 (FIGS. 1A-1C) or Embodiment 2 (FIGS. 2A-2C).

Alternatively, to produce a difference between the amounts of spin injection from two respective non-magnetic metal layers between which a magnetic metal layer is sandwiched, the resistivity values of the two non-magnetic metal layers may made different from each other.

As a further alternative, to produce a difference between the amounts of spin injection from two respective non-magnetic metal layers between which a magnetic metal layer is sandwiched, the densities of Cu atoms contained in the two non-magnetic metal layers may made different from each other.

Next, logic gates will be described below. First, a description will be made of how each of the magnetic logic device according to Embodiment 1 (FIGS. 1A-1C) or the magnetic logic device according to Embodiment 2 (FIGS. 2A-2C) is caused to operate as an AND gate and an OR gate.

FIGS. 6A-6C illustrate how the magnetic logic device according to Embodiment 1 (A-symmetry type) is caused to perform logic gate operations.

For example, inputs to the magnetic logic device are made by magnetizing each of the first conductive thin wire 11 and the second conductive thin wire 13 in a desired direction as a whole. FIG. 6A (left-hand column) shows four magnetization distributions, defined as four sets of inputs, of the left and right conductive thin wires 11 and 13.

FIG. 6B (central column) illustrates OR operations corresponding to the respective sets of inputs shown in FIG. 6A. FIG. 6C (right-hand column) illustrates AND operations corresponding to the respective sets of inputs shown in FIG. 6A.

In the following description, bit information "0" is defined as upward magnetization (indicated by low-density dots) and bit information "1" is defined as downward magnetization (indicated by high-density dots).

As described above, by virtue of the effect of the constriction 12a formed in the conductive thin wire 12 which is located between the conductive thin wires 11 and 13, the portion of the conductive thin wire 12 located on the side of the conductive thin wire 11 (on the left side) is magnetized in the same direction as the conductive thin wire 11 and the portion of the conductive thin wire 12 located on the side of the conductive thin wire 13 (on the right side) is magnetized in the same direction as the conductive thin wire 13.

This phenomenon is due to the property of a magnetic wall that it moves to a position where the cross section is small. That is, when the magnetization directions of the conductive thin wire 11 and the conductive thin wire 12 which are adjacent to each other are antiparallel with each other or the magnetization directions of the conductive thin wire 13 and the conductive thin wire 12 which are adjacent to each other are antiparallel with each other, the boundary magnetic wall moves to the narrowest portion of the constriction 12a so that its cross section is minimized. As a result, the above-mentioned polarization distributions are realized.

As shown in FIG. 6B, an OR operation using the magnetic logic device according to Embodiment 1 (see FIGS. 1A-1C) is realized by causing an electron flow to flow from the top of the left-hand conductive thin wire 11 to the bottom of the right-hand conductive thin wire 13 using a current application unit or a voltage application unit (not shown). As shown in FIG. 6C, an AND operation is realized by causing an electron flow to flow from the top of the right-hand conductive thin wire 13 to the bottom of the left-hand conductive thin wire 11 using the current application unit or the voltage application unit (not shown). In either case, an electron flow is caused to flow approximately downward in the Y-axis direction.

For example, the top of the conductive thin wire 11 and the top of the conductive thin wire 13 are used as input ends. Inputs are expressed as inputs (0, 0), inputs (1, 0), inputs (0, 1), or inputs (1, 1). And the bottom of the conductive thin wire 11 and the bottom of the conductive thin wire 13 are used as output ends. Outputs are expressed as outputs (0, 0), outputs (1, 0), outputs (0, 1), or outputs (1, 1).

To allow operations described below to be performed stably, as shown in FIGS. 6A-6C, a static magnetic field Happ may be applied to the magnetic logic device leftward in the X-axis direction.

FIG. 6B exemplifies an OR operation that is performed using the magnetic logic device according to Embodiment 1 (see FIGS. 1A-1C). In the OR operation shown in FIG. 6B, an electron flow is caused to flow from the top of the conductive thin wire 11 to the bottom of the conductive thin wire 11 approximately in the Y-axis direction.

Where the magnetic logic device is used as an OR logic gate, the output of the OR logic gate is defined as the magnetization direction of the bottom of the right-hand conductive thin wire 13. For inputs (0, 0) or inputs (1, 1), as shown in FIG. 6B, uniform downward or upward magnetization is maintained in the overall magnetic logic device. That is, the magnetization states are not changed at all by the application of the electron flow.

Therefore, in the case of inputs (0, 0), no changes occur in the magnetization states of the bottoms of the conductive thin wires 11 and 13 and hence outputs (0, 0) are obtained. Since the output of the OR logic gate is defined as the magnetization direction of the bottom of the conductive thin wire 13, an output "0" is obtained.

Likewise, in the case of inputs (1, 1), no changes occur in the magnetization states of the bottoms of the conductive thin wires 11 and 13 and hence outputs (1, 1) are obtained. Since the output of the OR logic gate is defined as the magnetization direction of the bottom of the conductive thin wire 13, an output "1" is obtained.

The second part of FIG. 6B shows a case of inputs (1, 0). When an OR operation is performed in this case, the magnetization state of the bottom of the conductive thin wire 13 is changed as described below and hence an output "1" is obtained.

The magnetic wall that has been located at the narrowest portion of the constriction 12a of the bridge portion is moved toward the right-hand conductive thin wire 13 due to the SHE described in FIGS. 4A to 4D and reaches there. As the flow of the electron flow is continued, the magnetic wall is pushed by the electron flow due to the spin torque effect occurring in the right-hand conductive thin wire 13 and is moved through the conductive thin wire 13 mainly toward its bottom end. Finally, the magnetization distribution shown in the second part of FIG. 6B is realized in the magnetic logic device. In this magnetization distribution, the magnetization direction of the bottom of the right-hand conductive thin wire 13 as the output of the OR logic gate is downward and hence an output "1" is obtained.

The third part of FIG. 6B shows a case of inputs (0, 1). When an OR operation is performed in this case, the magnetization direction of the bottom of the right-hand conductive thin wire 13 as the output becomes downward as described below and hence an output "1" is obtained.

When an electron flow is caused to flow from top-left to bottom-right as shown in the third part of FIG. 6B, the magnetic wall in the conductive thin wire 12 is moved as shown in FIG. 4B. The magnetic wall is moved leftward from the constriction 12a of the magnetic logic device and reaches the conductive thin wire 11. In this case, since the movement direction of the magnetic wall is opposite to the direction of the electron flow, a phenomenon occurs that is different than in the above-described case of inputs (1, 0).

In the case of inputs (1, 0), the magnetic wall reaches the conductive thin wire 13 and then goes further being pushed by the electron flow. In contrast, in the case of inputs (0, 1), the electron flow pushes back the magnetic wall toward the conductive thin wire 12 and hence the magnetic wall cannot enter the left-hand conductive thin wire 11.

If the flow of the electron flow is stopped in this state, because of the above-described property of the magnetic wall, the magnetic wall that has once reached the conductive thin wire 11 returns to the narrowest portion of the constriction 12a. As a result, the same magnetization distribution as at the time of the input is reproduced. In this manner, for inputs (0, 1), the magnetization direction of the bottom of the conductive thin wire 13 as the output of the OR logic gate is downward and hence an output "1" is obtained.

In summary, where an electron flow is caused to flow through the magnetic logic device from top-left to bottom-right, in other words, from the top of the conductive thin wire 11 to the bottom of the conductive thin wire 13, and the output is defined as the magnetization direction of the bottom of the conductive thin wire 13, outputs "0," "1," "1," and "1," are obtained for inputs (0, 0), inputs (1, 0), inputs (0, 1), and inputs (1, 1), respectively. As a result, the magnetic logic device according to Embodiment 1 can operate as an OR logic gate.

FIG. 6C exemplifies an AND operation that is performed using the magnetic logic device according to Embodiment 1 (see FIGS. 1A-1C). In the AND operation shown in FIG. 6C, an electron flow is caused to flow through the magnetic logic device from top-right to bottom-left, that is, from the top of the conductive thin wire 13 to the bottom of the conductive thin wire 11. And the output of the AND logic gate is defined as the magnetization direction of the bottom of the left-hand conductive thin wire 11 after the electron flow is finished.

For example, for inputs (0, 0) or inputs (1, 1), as in the case of the OR operation, uniform downward or upward magnetization is maintained in the overall magnetic logic device though the electron flow flows from top-right to bottom-left. That is, the magnetization states at the time of the input are maintained as they are. Thus, outputs "0" and "1" are obtained for inputs (0, 0) and inputs (1, 1), respectively.

In the case of inputs (1, 0), when an electron flow is caused to flow from top-right to bottom-left, changes occur in the magnetization distribution as do in the OR operation. In this case, the magnetic wall is pushed leftward in the conductive thin wire 12. After reaching the left-hand conductive thin wire 11, the magnetic wall continues to be moved in the same direction as the electron flow. Finally, the magnetization distribution shown in the second part of FIG. 6C is realized. Since the output is defined as the magnetization direction of the bottom of the left-hand conductive thin wire 11, output "0" is obtained for inputs (1, 0).

In the case that inputs (0, 1) are set to the magnetic logic device, when an electron flow is caused to flow from top-right to bottom-left, the magnetic wall is pushed rightward in the conductive thin wire 12 due to the SHE. After reaching the right-hand conductive thin wire 13 where the SHE no longer occurs, the magnetic wall is pushed back by spin torque and stays in the conductive thin wire 12. When the flow of the electron flow is stopped, the magnetic wall is moved to the narrowest portion of the constriction 12a, whereby the same magnetization distribution as at the time of the input is reproduced.

In summary, where an electron flow is caused to flow through the magnetic logic device from top-right to bottom-left and the output is defined as the magnetization direction of the bottom of the left-hand conductive thin wire 11, outputs "0," "0," "0," and "1," are obtained for inputs (0, 0), inputs (1, 0), inputs (0, 1), and inputs (1, 1), respectively. As a result, the magnetic logic device according to Embodiment 1 can also operate as an AND logic gate.

FIGS. 7A-7C illustrate how the magnetic logic device according to Embodiment 2 (B-symmetry type) is caused to perform logic gate operations.

The relationships between the electron flow and the movement of the magnetic wall in the conductive thin wire 12 of the magnetic logic device according to Embodiment 2 are opposite to those in the conductive thin wire 12 of the magnetic logic device according to Embodiment 1. As a result, as shown in FIGS. 7A-7C, where the magnetic logic device according to Embodiment 2 is used, the relationships between the manner of flow of an electron flow/definition of the output and the resulting logic gate operation are opposite to those of the case of using the magnetic logic device according to Embodiment 1.

Figure 8B:
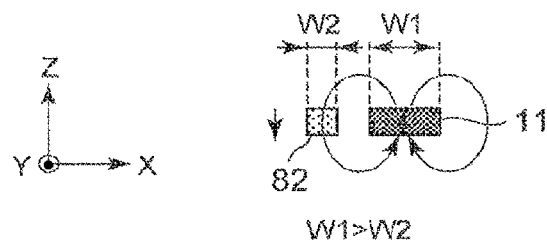

FIGS. 8A and 8B illustrate a first example configuration of applying magnetic coupling to magnetic thin wires as used in Embodiment 1. In the first example configuration, magnetostatic coupling is applied to magnetic thin wires as used in Embodiment 1 to enable transmission of an output of a prescribed magnetic logic device to a magnetic logic device of the next stage.

As shown in FIG. 8A, two conductive thin wires 11 and 81 which are magnetized in the Z-axis direction are assumed. Like the first conductive thin wire 11 and the second conductive thin wire 13 of the magnetic logic device according to Embodiment 1, each of the two conductive thin wires 11 and 81 is configured in such a manner that a magnetic metal layer is sandwiched between non-magnetic metal layers. The conductive thin wire 11 has a width W1 in the X-axis direction. The conductive thin wire 81 has a width W1 in the X-axis direction except a narrow portion 82. The narrow portion 82 of the conductive thin wire 81 has, in the X-axis direction, a width W2 which is smaller than the width W1. That is, the width W1 of the conductive thin wire 11 is greater than the width W2 of the narrow portion 82 of the conductive thin wire 81 (W1>W2).

The narrow portion 82 of the conductive thin wire 81 and the conductive thin wire 11 are set adjacent to each other with such a distance that the narrow portion 82 is influenced by a magnetic field generated by the conductive thin wire 11 through magnetic coupling. The narrow portion 82 of the conductive thin wire 81 is exposed to the magnetic field generated by the conductive thin wire 11, and the conductive thin wire 11 is exposed to a magnetic field generated by the narrow portion 82.

FIG. 8B is a sectional view taken along line A-B in FIG. 8A. The lamination structure of each of the conductive thin wires 11 and 81 is not illustrated here. It is also seen from FIG. 8B that the width W2 of the narrow portion 82 of the conductive thin wire 81 is smaller than the width W1 of the conductive thin wire 11.

Since the width W2 of the narrow portion 82 of the conductive thin wire 81 is smaller than the width W1 of the conductive thin wire 11, the narrow portion 82 having the width W2 is magnetized by the magnetic field generated by the conductive thin wire 11 having the width W1 in the direction opposite to the magnetization direction of the conductive thin wire 11 (magnetostatic coupling). The magnetostatic coupling becomes more stable as the width ratio W2/W1 is decreased to ½, ⅓, or even smaller value.

Figure 9:
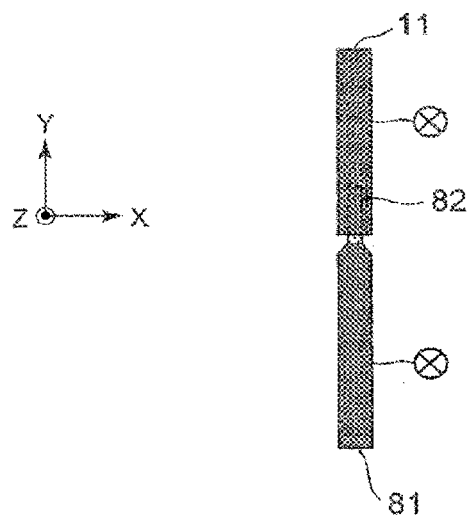

FIG. 9 illustrates a second example configuration of transmitting an output by applying magnetostatic coupling to conductive thin wires as used in Embodiment 1.

As in the first example configuration, a conductive thin wire 11 and a major part of a conductive wire 81 each have a width W1 in the X-axis direction and a narrow portion 82 of the conductive thin wire 81 has, in the X-axis direction, a width W2 which is smaller than the width W1 (W1>W2).

In the second example configuration, the conductive thin wires 11 and 81 are arranged in such manners that they overlap with each other and that the narrow portion 82 of the conductive thin wire 81 and the conductive thin wire 11 are set adjacent to each other in the Z-axis direction so as to overlap with each other with such a distance that the narrow portion 82 is influenced by a magnetic field generated by the conductive thin wire 11 through magnetic coupling.

It is important that the narrow portion 82 of the conductive thin wire 81 and the conductive thin wire 11 be set adjacent to each other with such a distance that the narrow portion 82 is influenced by the conductive thin wire 11 through magnetic coupling. To this end, the narrow portion 82 of the conductive thin wire 81 and the conductive thin wire 11 may be in contact with each other in the Z-axis direction. To avoid electrical contact, it is desirable that an insulating layer or a gap be formed between the two adjoining conductive thin wire 11 and 81.

As described above, in the second example configuration, the narrow portion 82 (width: W2) of the conductive thin wire 81 and the conductive thin wire 11 (width: W1) are coupled to each other magnetostatically in the region where they are adjacent to each other. As a result, information can be transmitted from the conductive thin wire 11 to the conductive thin wire 81 even if the two conductive thin wire 11 and 81 which are coupled to each other magnetostatically (magnetically) are not in direct contact with each other.

Figure 10:
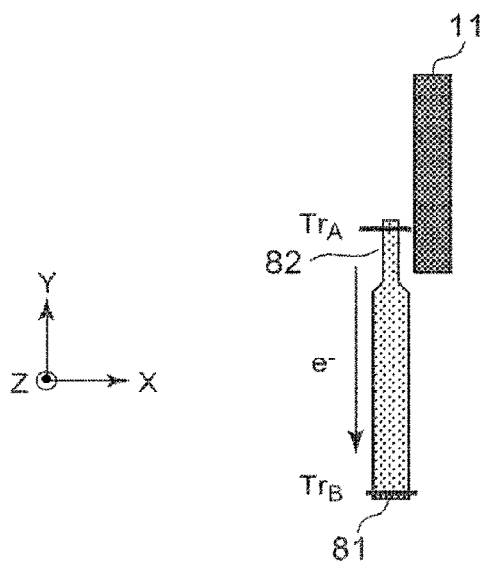

FIG. 10 illustrates a third example configuration of transmitting an output by applying magnetostatic coupling to conductive thin wires as used in Embodiment 1.

In the third example configuration, as shown in FIG. 10, a narrow portion 82 (width: W2) of a conductive thin wire 81 is provided with an interconnection $Tr_A$ at one end of the narrow portion 82 (i.e., at one end of the conductive thin wire 81) and a wide portion (width: W1) of the conductive thin wire 81 is provided with an interconnection $Tr_B$ at the other end of the conductive thin wire 81. An electron flow (−e) is caused to flow through the conductive thin wire 81 downward in the Y-axis direction.

As a result, the magnetic wall is moved, whereby a major part of the conductive thin wire 81 having the narrow portion 82 (width: W2) can be magnetized in the direction opposite to the magnetization direction of a wide conductive thin wire 11.

With the above configuration, in the third example configuration, magnetic information can be transmitted from a prescribed constituent element (logic device) to a constituent element (logic device) of the next stage without the need for directly connecting conductive thin wires to each other.

By connecting constituent elements (logic devices) in the above-described manner, an electron flow path can be divided into a path involving a single magnetic logic device and a path involving other magnetic logic devices. Thus, the third example configuration facilitates construction of a magnetic logic circuit.

Figure 11:
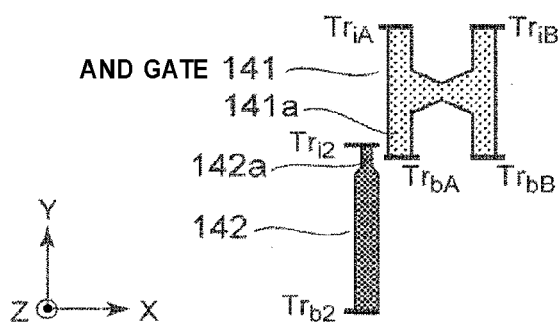
FIG. 11 illustrates an example NAND gate circuit in which magnetic coupling is applied to a magnetic logic device according to Embodiment 1 (A-symmetry).

FIG. 11 illustrates an example NAND gate circuit in which magnetic coupling is applied to a magnetic logic device 141 according to Embodiment 1 (A-symmetry) as an AND gate. The magnetic logic device 141 is an AND gate. The magnetization direction of a bottom end 141a of a left-hand conductive thin wire serves as the output of the AND gate 141.

As in the case of FIG. 10, a conductive thin wire 142 has a narrow portion 142a at one end. The narrow portion 142a is set adjacent to the output end 141a of the AND gate 141 so as to be influenced by the output end 141a through magnetic coupling. In this manner, magnetic coupling between the AND gate 141 and the conductive thin wire 142 is realized.

Figure 12:
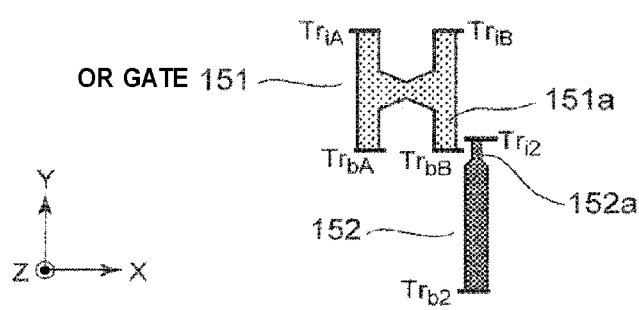
FIG. 12 illustrates an example NOR gate circuit in which magnetic coupling is applied to a magnetic logic device according to Embodiment 1 (A-symmetry).

FIG. 12 illustrates an example NOR gate circuit in which magnetic coupling is applied to a magnetic logic device 151 according to Embodiment 1 (A-symmetry) as an OR gate. The magnetic logic device 151 is an OR gate. The magnetization direction of a bottom end 151a of a right-hand conductive thin wire 152 serves as the output of the OR gate 151.

A conductive thin wire 152 has a narrow portion 152a at one end. The narrow portion 152a is set adjacent to the output end 151a of the OR gate 151 so as to be influenced by the output end 151a through magnetic coupling. In this manner, magnetic coupling between the OR gate 151 and the conductive thin wire 152 is realized.

When magnetic information is transmitted between two stages through magnetic coupling, the magnetic information is inverted (NOT operation). Therefore, the configurations of FIGS. 11 and 12 function as a NAND gate and a NOR gate, respectively, as a whole.

In general, any Boolean function can represented by a combination of only NAND gates or NOR gates. Therefore, in principle, any combinational logic network can be constructed by combining the configurations of FIG. 11 or 12.

Figure 13:
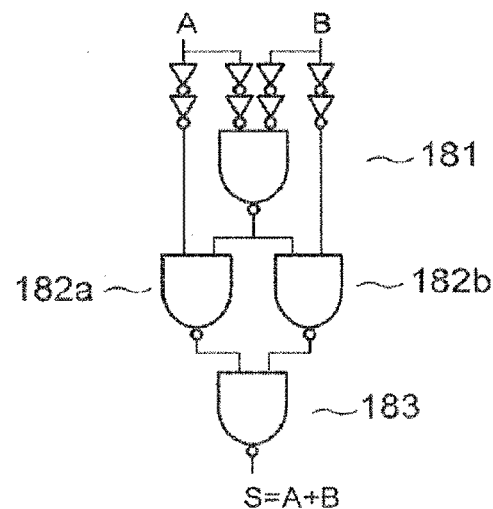
FIG. 13 illustrates an example logic diagram of an XOR gate.

FIG. 13 illustrates an example logic diagram of an XOR gate. An XOR gate function as a part of a half adder for calculating a sum. As shown in FIG. 13, the XOR gate consists of three NAND gate stages: the first stage includes a NAND gate 181, the second stage consists of NAND gates 182a and 182b, and the third stage is formed by a NAND gate 183. That is, an XOR gate can be realized by connecting three NAND gate stages.

Figure 14:
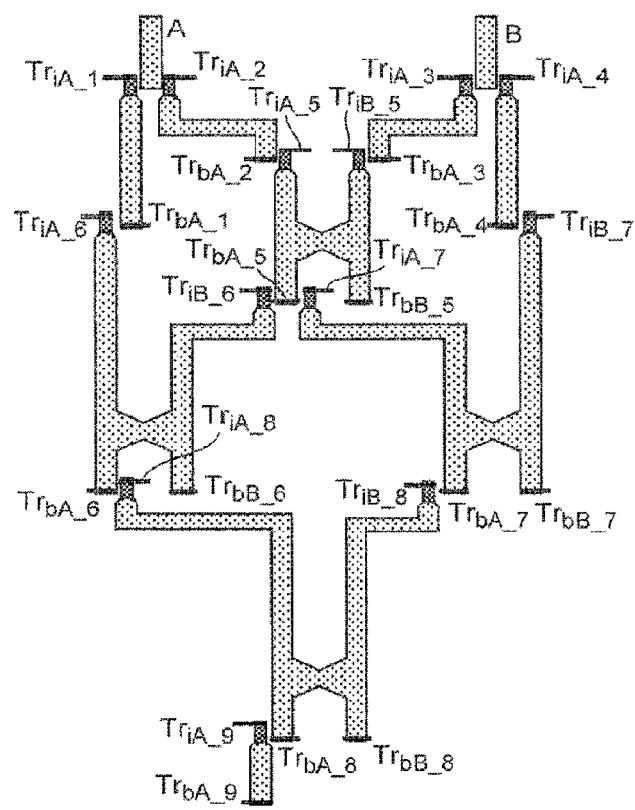
FIG. 14 illustrates an example XOR-equivalent circuit using magnetic logic devices of FIG. 11.

FIG. 14 illustrates an example XOR-equivalent circuit using magnetic logic devices of FIG. 11 each of which operates as a NAND gate.

In FIG. 14, A and B represents two inputs and S represents the sum of a half adder (i.e., exclusive OR (XOR)) for the two inputs A and B. In the example of FIG. 14, pairs of NOT gates are disposed immediately after the input terminals to arbitrate between the characteristics of magnetic coupling and application timing of electron flows.

FIGS. 15-24 illustrate an operation of the XOR-equivalent circuit of FIG. 14.

First, all of the constituent magnetic logic devices in the XOR-equivalent circuit of FIG. 14 are initialized to "0."

Figure 15:
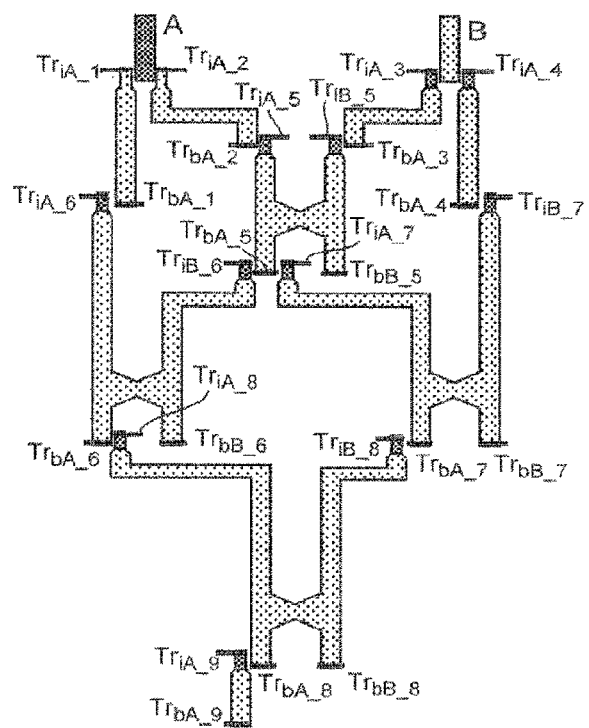
FIGS. 15-24 illustrate an operation of the XOR-equivalent circuit of FIG. 14.

Then, inputs (A, B)=(1, 0) are set, whereby a state shown in FIG. 15 is obtained. The narrow portions, adjacent to the conductive thin wire for the input A, of magnetic coupling conductive thin wires have a magnetic state "0." On the other hand, the narrow portions, not adjacent to the conductive thin wire for the input A, of magnetic coupling conductive thin wires have a magnetic state "1" (opposite state) because they were initialized to "0" as mentioned above.

An intended operation can be performed using this magnetic logic circuit as long as the internal states of the constituent magnetic logic devices are known. Therefore, the constituent magnetic logic devices need not always be initialized every time an operation is performed.

To cause the XOR-equivalent circuit of FIG. 14 to operate, four sets of electron flows (electron flows A to electron flows D) having the following patterns are caused to flow successively.

Figure 16:
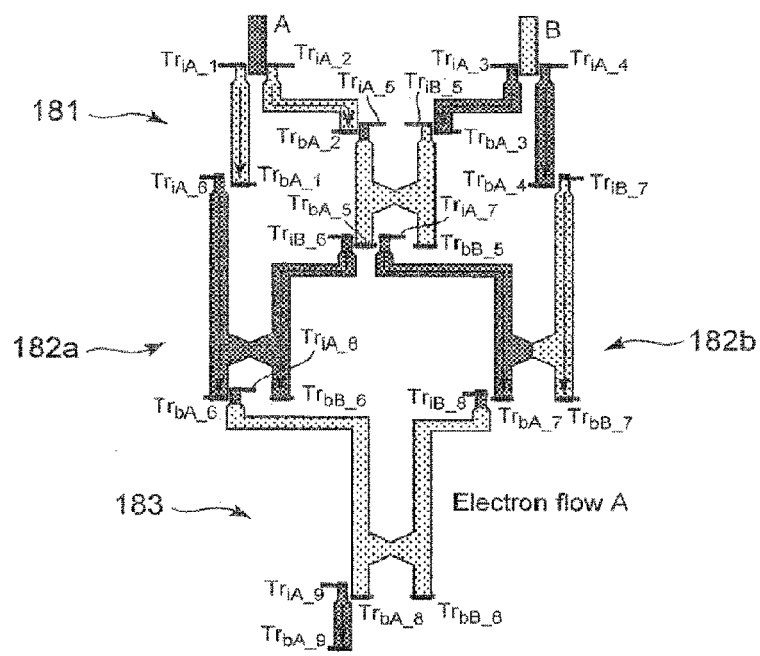

FIG. 15 shows the magnetic logic circuit in which no electron flows have been caused yet. FIG. 16 shows a result of flowing of electron flows A (indicated by arrows) in the magnetic logic circuit being in the state of FIG. 15.

The electron flows A are nine electron flows that flow from $Tr_{iA\_1}$ to $Tr_{bA\_1}$, from $Tr_{iA\_2}$ to $Tr_{bA\_2}$, from $Tr_{iA\_3}$ to $Tr_{bA\_3}$, from $Tr_{iA\_4}$ to $Tr_{bA\_4}$, from $Tr_{iA\_6}$ to $Tr_{bA\_6}$, from $Tr_{iB\_6}$ to $Tr_{bB\_6}$, from $Tr_{iA\_7}$ to $Tr_{bA\_7}$, from $Tr_{iB\_7}$ to $Tr_{bB\_7}$, and from $Tr_{iA\_9}$ to $Tr_{bA\_9}$, respectively. There are no particular limitations on the order of flowing of the nine electron flows.

As a result of the flowing of the electron flows A, the inputs A and B are transmitted to the first-stage NAND gate 181 and set as gate inputs for the second-stage NAND gates 182a and 182b.

Figure 17:
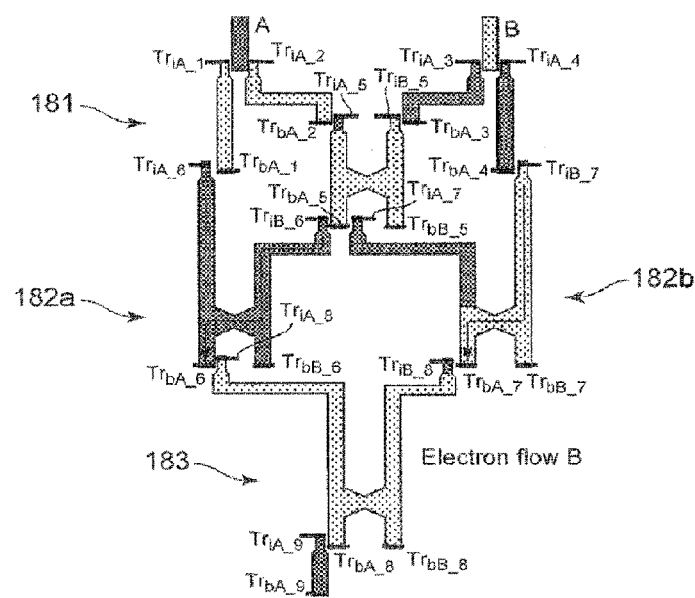

FIG. 17 shows a result of flowing of electron flows B in the magnetic logic circuit being in the state of FIG. 16. The electron flows B are two electron flows that flow from $Tr_{iB\_6}$ to $Tr_{bA\_6}$ and from $Tr_{iB\_7}$ to $Tr_{bA\_7}$, respectively.

Figure 18:
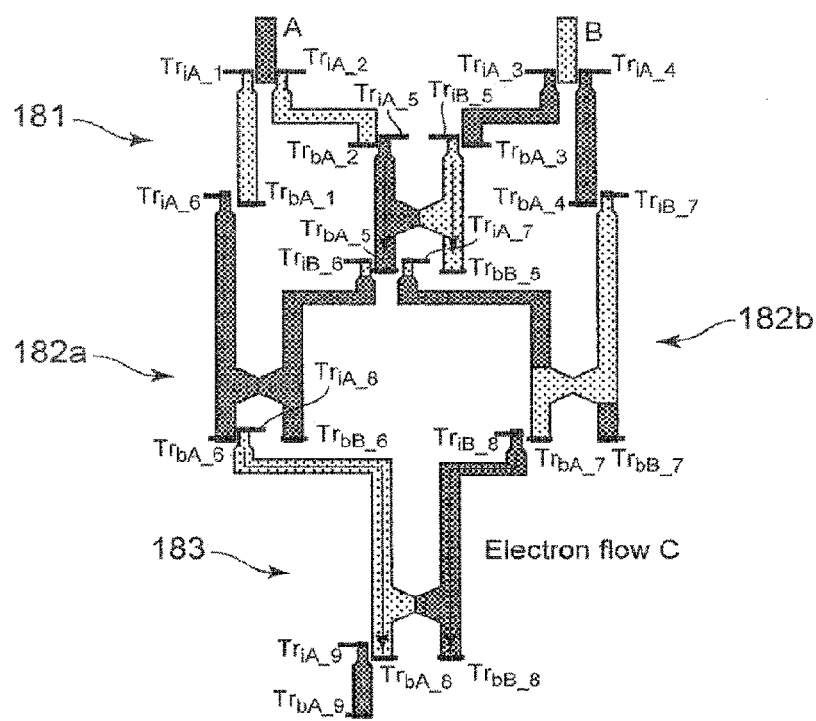

FIG. 18 shows a result of flowing of electron flows C in the magnetic logic circuit being in the state of FIG. 17. The electron flows C are four electron flows that flow from $Tr_{iA\_5}$ to $Tr_{bA\_5}$, from $Tr_{iB\_5}$ to $Tr_{bB\_5}$, $Tr_{iA\_8}$ to $Tr_{bA\_8}$, from $Tr_{iB\_8}$ to $Tr_{bB\_8}$, respectively.

As a result of the flowing of the electron flows C, pieces of magnetic information are set in the first-stage NAND gate 181 and the third-stage NAND gate 183.

Figure 19:
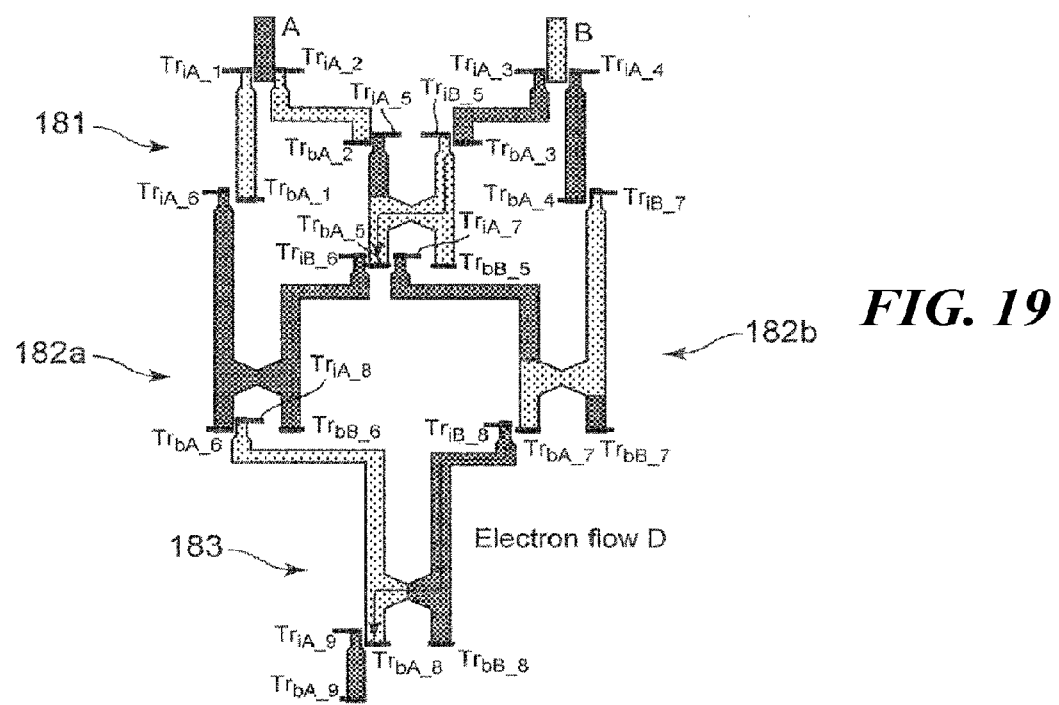

FIG. 19 shows a result of flowing of electron flows D in the magnetic logic circuit being in the state of FIG. 18. The electron flows D are two electron flows that flow from $Tr_{iB\_5}$ to $Tr_{bA\_5}$ and from $Tr_{iB\_8}$ to $Tr_{bA\_8}$, respectively.

As a result of the flowing of the electron flows D, the first-stage NAND gate 181 and the third-stage NAND gate 183 perform operations.

Figure 20:
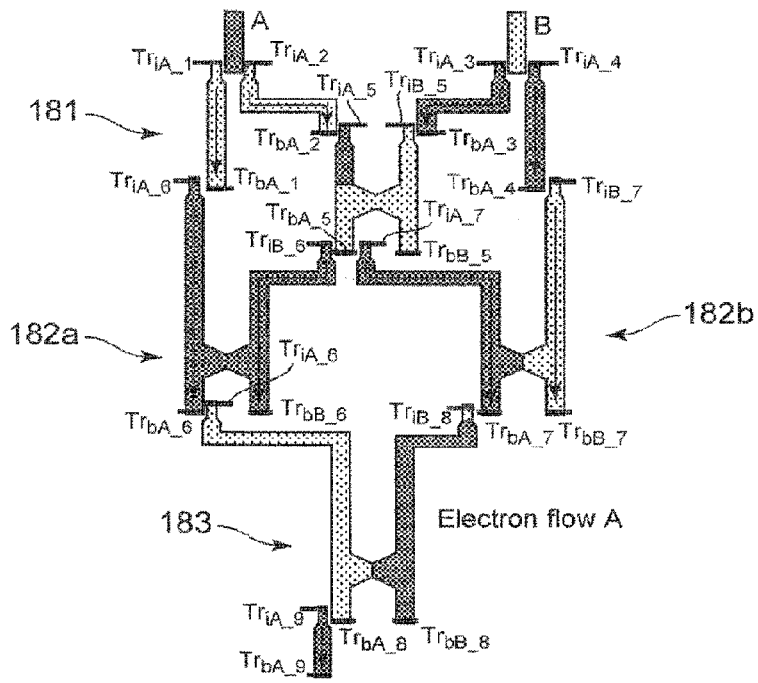

FIG. 20 shows a result of second-time flowing of electron flows A in the magnetic logic circuit being in the state of FIG. 19. As in the case of the first-time flowing of electron flows A, the inputs A and B (pieces of magnetic information) are transmitted to the first-stage NAND gate 181.

The result shown in FIG. 20 is different from the result of the first-time flowing of electron flows A shown in FIG. 16 in that a result of the operation that has already been performed by the first-stage NAND gate 181 as a result of the flowing of the sets of electron flows is set in the second-stage NAND gates 182a and 182b as pieces of magnetic information.

Figure 21:
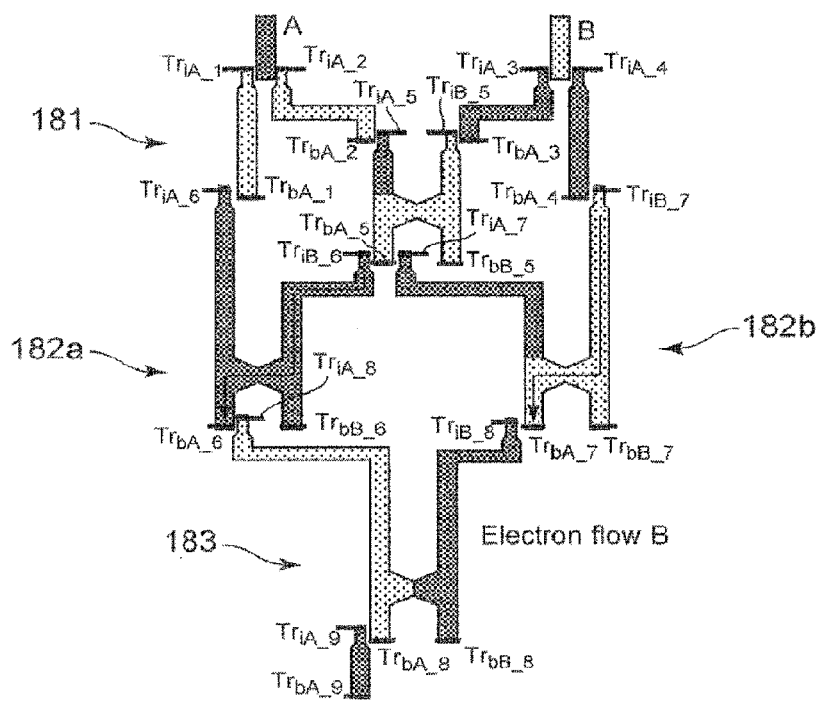

FIG. 21 shows a result of second-time flowing of electron flows B in the magnetic logic circuit being in the state of FIG. 20. The second-time flowing of electron flows B is the same as the first-time flowing of electron flows B shown in FIG. 17 in that it causes the second-stage NAND gates 182a and 182b to perform operations. However, the result of the former is different from that of the latter in that operation results of the second-stage NAND gates 182a and 182b reflect the operation result of the first-stage NAND gate 181.

Figure 22:
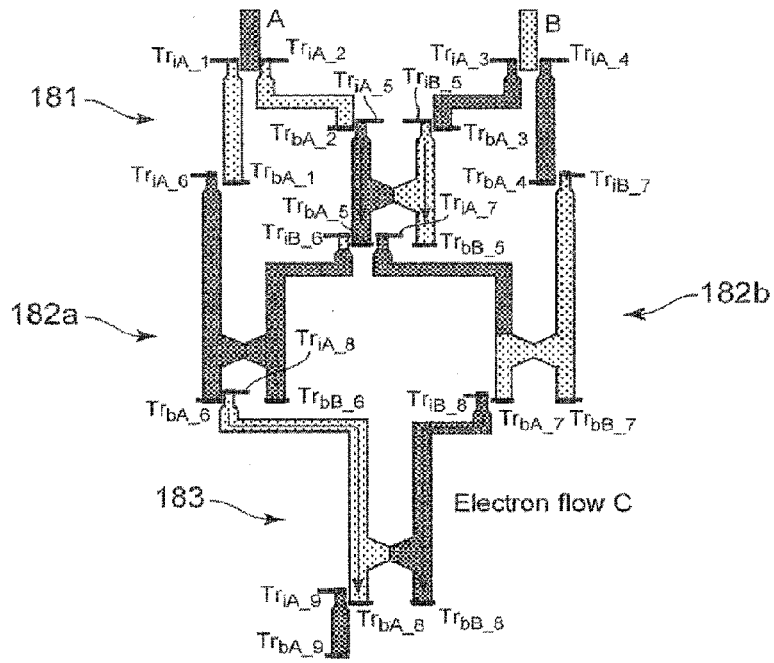

FIG. 22 shows a result of second-time flowing of electron flows C in the magnetic logic circuit being in the state of FIG. 21. The result shown in FIG. 22 is the same as the result of the first-time flowing of electron flows C shown in FIG. 18 in that pieces of magnetic information are set in the first-stage NAND gate 181 and the third-stage NAND gate 183. However, the former is different from the latter in that an operation result of the third NAND gate 183 reflects the operation result of the first-stage NAND gate 181 and operation results of the second-stage NAND gates 182a and 182b.

Figure 23:
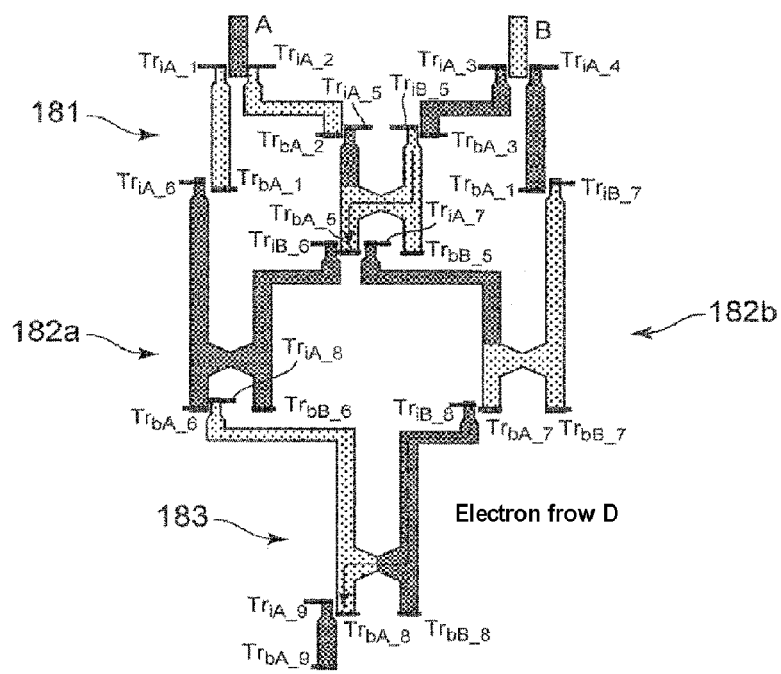

FIG. 23 shows a result of second-time flowing of electron flows D in the magnetic logic circuit being in the state of FIG. 22. The second-time flowing of the electron flows D is the same as the first-time flowing of electron flows D (see FIG. 19) in that it causes the first-stage NAND gate 181 and the third-stage NAND gate 183 to perform operations. However, the result of the former is different from that of the latter in that an operation result of the third NAND gate 183 reflects the operation results of the preceding stages. Thus, as a result of the second-time flowing of electron flows D, a final result appears at the output terminal of the third NAND gate 183.

Figure 24:
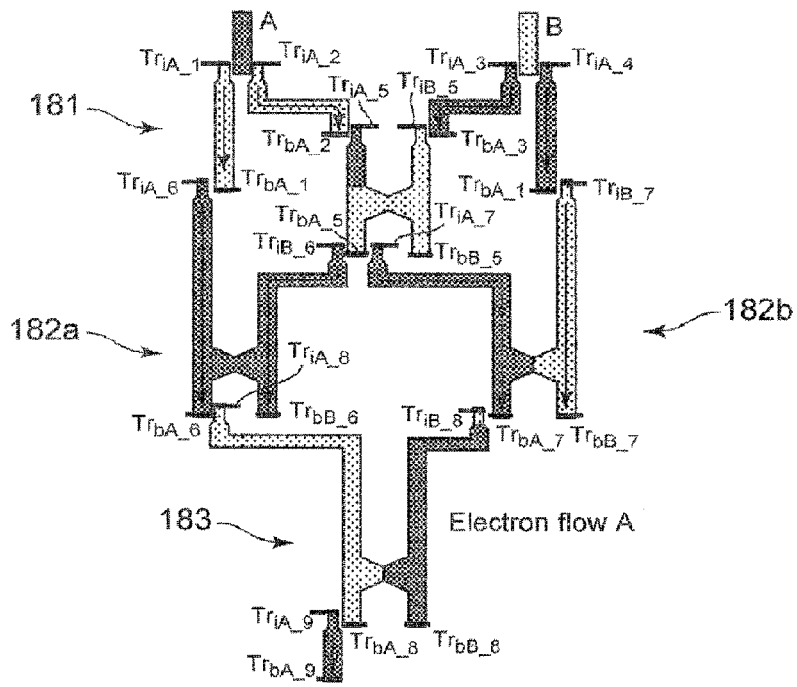

FIG. 24 shows a result of third-time flowing of electron flows A in the magnetic logic circuit being in the state of FIG. 23. As a result of the execution of this step, the operation result of the third NAND gate 183 is output to the outside of the magnetic logic circuit.

In the state shown in FIG. 24, no changes have been made in the inputs. If the magnetic logic circuit receives different inputs in this state, it starts to perform a new operation. On the other hand, the operation result remains the same as long as the above-described cycle of flowing of sets of electron flows is repeated. In this respect, the magnetic logic circuit being discussed is the same as a corresponding combinational logic network using transistors.

Figure 25:
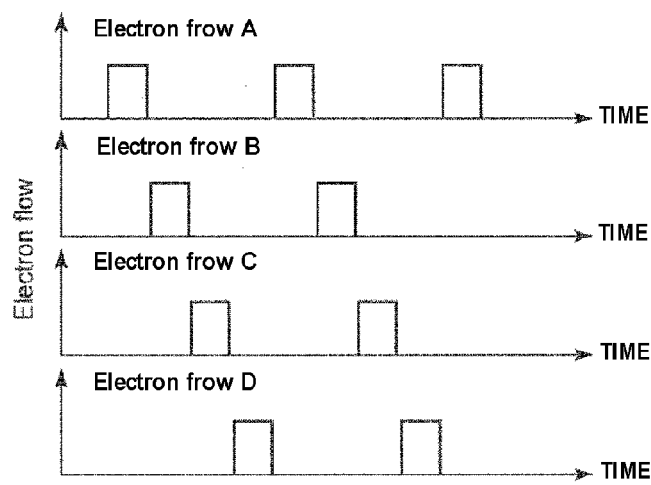
FIG. 25 illustrates the timing of electron flows in the XOR-equivalent circuit of FIG. 14.

FIG. 25 illustrates the timing of electron flows in the XOR-equivalent circuit of FIG. 14. Controls for causing sets of electron currents in the magnetic logic circuit are performed by an electron flow application control unit (not shown), for example.

As described above, the XOR-equivalent circuit of FIG. 14 performs an exclusive OR operation when a cycle of flowing of electron flows A to electron flows D shown in FIG. 25 is performed two times repeatedly. When electron flows A are caused for the third time, output from and input to the magnetic logic circuit are made simultaneously.

Figure 26A:
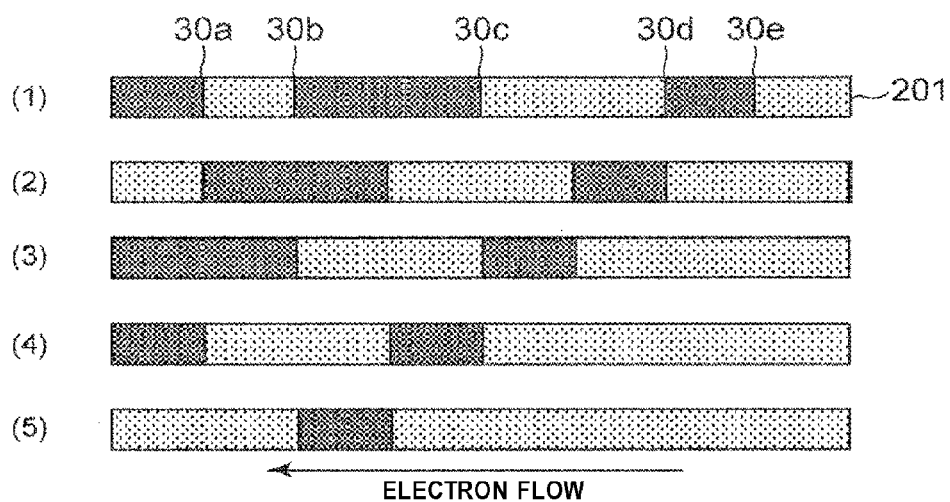
FIGS. 26A and 26B illustrate a memory that uses a conductive thin wire as used in the magnetic logic device according to Embodiment 1 or Embodiment 2.
Figure 26B:
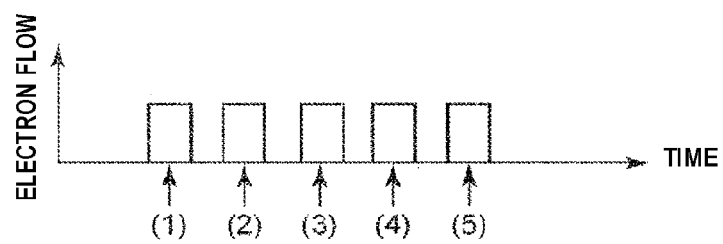

FIGS. 26A and 26B illustrate a memory that uses a conductive thin wire 201 having the same structure as the conductive thin wires used in the magnetic logic device according to Embodiment 1 or Embodiment 2 (see FIGS. 1A-1C and FIGS. 2A-2C). Extending in the longitudinal direction, the conductive thin wire 201 can possess plural magnetic walls (domains).

Reference symbols 30a-30e denote plural magnetic walls. As shown in FIGS. 26A and 26B, the magnetic walls 30a-30e can be translated by causing an electron flow to flow through the conductive thin wire 201 right to left in the paper surface. As such, the conductive thin wire 201 can serve as an information storage place (i.e., memory).

In FIG. 26A, symbol (1) denotes an initial state. As seen from FIG. 26A (steps (2)-(5)), the magnetic walls 30a-30e can be moved right to left in the paper surface by causing pulses of electron flows to flow successively in the manner shown in FIG. 26B.

The movement distance of the magnetic walls 30a-30e is determined by the product of the magnetic wall movement speed that is approximately proportional to the magnitude of an electron flow and the pulse duration.

If adjoining ones of the magnetic walls 30a-30e are too close to each other, the domain between them may become unstable and disappear, which means loss of the magnetic information stored there. In view of this, it is desirable that the intervals between the magnetic walls 30a-30e be longer than 30 nm.

Figure 27:
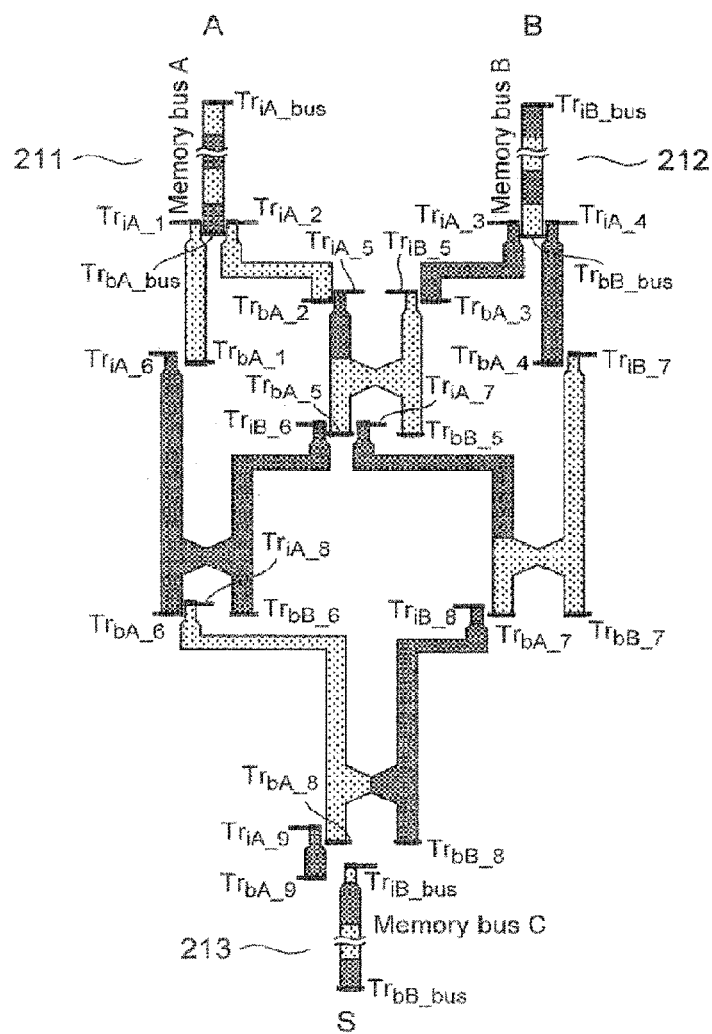
FIG. 27 illustrates an example of combining the XOR-equivalent circuit of FIG. 14 and the conductive thin wire of FIGS. 26A and 24B.

FIG. 27 illustrates an example of combining the XOR-equivalent circuit of FIG. 14 and the conductive thin wires of FIGS. 26A and 26B.

In this magnetic logic circuit, conductive thin wires 211-213 serve as information storage places as well as information transmission paths (memory buses) and are combined with the XOR-equivalent circuit of FIG. 14. An input A is supplied to the conductive thin wire 211 (memory bus A) and an input B is supplied to the conductive thin wire 212 (memory bus B). An output S appears in the conductive thin wire 213 (memory bus C).

Figure 28:
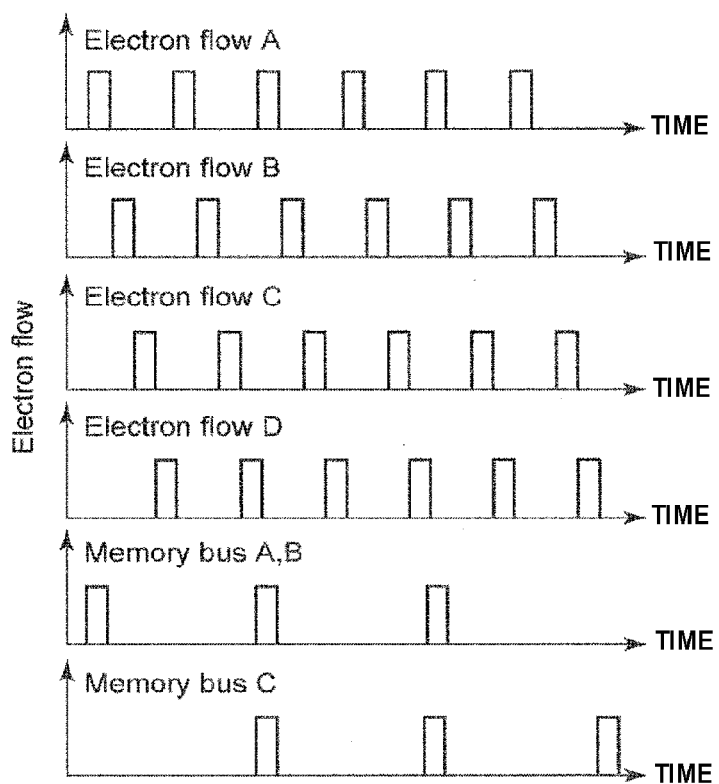
FIG. 28 illustrates an operation of the circuit of FIG. 27.

FIG. 28 illustrates an operation of the circuit of FIG. 27. As sets of electron currents are caused to flow through the XOR gate and the memory buses A, B, and C, XOR operation results corresponding to pairs of pieces of bit information stored in the memory buses A and B in sequential form come to be stored in the memory bus C also in sequential form.

The above-described embodiments can improve a logic circuit that uses magnetic logic devices.

Although the several embodiments have been described above, they are just examples and should not be construed as restricting the scope of the invention. Each of these novel embodiments may be practiced in various other forms, and part of it may be omitted, replaced by other elements, or changed in various manners without departing from the spirit and scope of the invention. Such modifications will also fall within the scope of the invention.

The invention claimed is:

1. A magnetic logic device comprising:
a first conductive thin wire;
a second conductive thin wire; and
a third conductive thin wire that electrically connects the first conductive thin wire and the second conductive thin wire,
wherein the first to third conductive thin wires commonly includes:
a first non-magnetic metal layer;
a second non-magnetic metal layer; and
a magnetic metal layer sandwiched between the first non-magnetic metal layer and the second non-magnetic metal layer,
wherein the third conductive thin wire extends in a longitudinal direction, and
wherein the third conductive thin wire has a constriction that is narrower in a direction perpendicular to the longitudinal direction than the other portions.

2. The magnetic logic device of claim 1,
wherein each of the first non-magnetic metal layer, the second non-magnetic metal layer and the magnetic metal layer is a common film electrically continuous over the first to third conductive thin wires.

3. The magnetic logic device of claim 1,
wherein, in the third conductive thin wire, the first non-magnetic metal layer is formed to have a thickness which is different from a thickness of the second non-magnetic metal layer.

4. The magnetic logic device of claim 1,
wherein, in the third conductive thin wire, the first non-magnetic metal layer is formed to have a resistivity of which is different from a resistivity of the second non-magnetic metal layer.

5. The magnetic logic device of claim 1,
wherein, in the third conductive thin wire, the first non-magnetic metal layer is formed to have a content of a first material which is different from a content of the first metal of the second non-magnetic metal layer.

6. The magnetic logic device of claim 1,
wherein the constriction is provided in the third conductive thin wire between the first conductive thin wire and the second conductive thin wire.

7. The magnetic logic device of claim 6,
wherein the third conductive thin wire is provided to bridge the first conductive thin wire and the second conductive thin wire.

8. The magnetic logic device of claim 1, further comprising:
a fourth conductive thin wire that is magnetically coupled to the first conductive thin wire.

9. The magnetic logic device of claim 8, further comprising:
a memory bus comprising a conductive thin wire.

10. A magnetic logic circuit, comprising:
a magnetic logic device comprising:
a first conductive thin wire;
a second conductive thin wire; and
a third conductive thin wire that electrically connects the first conductive thin wire and the second conductive thin wire,
wherein the first to third conductive thin wires commonly includes:
a first non-magnetic metal layer;
a second non-magnetic metal layer; and
a magnetic metal layer sandwiched between the first non-magnetic metal layer and the second non-magnetic metal layer; and
a fourth conductive thin wire that is magnetically coupled to the first conductive thin wire,
wherein the magnetic logic device functions as an AND gate or an OR gate.

11. A magnetic logic device comprising:
a first conductive thin wire;
a second conductive thin wire; and
a third conductive thin wire that electrically connects the first conductive thin wire and the second conductive thin wire,
wherein the first to third conductive thin wires commonly includes:
a first non-magnetic metal layer;
a second non-magnetic metal layer; and
a magnetic metal layer sandwiched between the first non-magnetic metal layer and the second non-magnetic metal layer; and
wherein the third conductive thin wire has a constriction.

12. The magnetic logic device of claim 11,
wherein each of the first non-magnetic metal layer, the second non-magnetic metal layer and the magnetic metal layer is a common film electrically continuous over the first to third conductive thin wires.

13. The magnetic logic device of claim 11,
wherein, in the third conductive thin wire, the first non-magnetic metal layer is formed to have a thickness which is different from a thickness of the second non-magnetic metal layer.

14. The magnetic logic device of claim 11,
wherein, in the third conductive thin wire, the first non-magnetic metal layer is formed to have a resistivity of which is different from a resistivity of the second non-magnetic metal layer.

15. The magnetic logic device of claim 11,
wherein, in the third conductive thin wire, the first non-magnetic metal layer is formed to have a content of a first material which is different from a content of the first metal of the second non-magnetic metal layer.

16. The magnetic logic device of claim 11,
wherein a longitudinal axis of the third conductive thin wire crosses a longitudinal axis of the first conductive thin wire and a longitudinal axis of the second conductive thin wire.

17. The magnetic logic device of claim 16,
wherein each of the first non-magnetic metal layer, the second non-magnetic metal layer and the magnetic metal layers is a common film electrically continuous over the first to third conductive thin wires.

18. The magnetic logic device of claim 16,
wherein, in the third conductive thin wire, the first non-magnetic metal layer is formed to have a thickness which is different from a thickness of the second non-magnetic metal layer.

19. The magnetic logic device of claim 16,
wherein, in the third conductive thin wire, the first non-magnetic metal layer is formed to have a resistivity of which is different from a resistivity of the second non-magnetic metal layer.

20. The magnetic logic device of claim 16,
wherein, in the third conductive thin wire, the first non-magnetic metal layer is formed to have a content of a first material which is different from a content of the first metal of the second non-magnetic metal layer.

* * * * *